United States Patent
Park et al.

(10) Patent No.: US 11,121,064 B2
(45) Date of Patent: Sep. 14, 2021

(54) SEMICONDUCTOR PACKAGE

(71) Applicant: Samsung Electronics Co., Ltd., Suwon-si (KR)

(72) Inventors: Jung-Ho Park, Cheonan-si (KR); Da Hye Kim, Gwangmyeong-si (KR); Jin-Woo Park, Seoul (KR); Jae Gwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 16/819,318

(22) Filed: Mar. 16, 2020

(65) Prior Publication Data

US 2021/0057317 A1 Feb. 25, 2021

(30) Foreign Application Priority Data

Aug. 19, 2019 (KR) .......................... 10-2019-0100932

(51) Int. Cl.
*H01L 23/495* (2006.01)
*H01L 23/498* (2006.01)
*H01L 23/31* (2006.01)

(52) U.S. Cl.
CPC .... *H01L 23/49816* (2013.01); *H01L 23/3128* (2013.01); *H01L 23/49822* (2013.01); *H01L 23/49838* (2013.01)

(58) Field of Classification Search
CPC ........... H01L 23/3128; H01L 23/49822; H01L 23/49838; H01L 23/49816
USPC ........................................................ 257/668
See application file for complete search history.

(56) References Cited

U.S. PATENT DOCUMENTS

| 8,546,954 | B2 * | 10/2013 | Kwon | H01L 25/105 |
| 8,969,191 | B2 | 3/2015 | Chen | |
| 8,970,051 | B2 | 3/2015 | Shi et al. | |
| 9,048,168 | B2 * | 6/2015 | Kwon | H01L 25/00 |
| 9,385,098 | B2 * | 7/2016 | Zhang | H01L 23/49816 |
| 9,425,157 | B2 | 8/2016 | Lin et al. | |
| 9,462,691 | B1 | 10/2016 | Xie | |
| 9,515,039 | B2 | 12/2016 | Lai et al. | |
| 9,536,865 | B1 | 1/2017 | Kuo et al. | |
| 9,553,065 | B2 | 1/2017 | Lin et al. | |
| 9,679,861 | B1 | 6/2017 | Hool | |

(Continued)

FOREIGN PATENT DOCUMENTS

KR  20150124251 A  11/2015

*Primary Examiner* — Luan C Thai
(74) *Attorney, Agent, or Firm* — Muir Patent Law, PLLC

(57) ABSTRACT

A semiconductor package having a redistribution structure including a first face and a second face and a first semiconductor chip mounted on the first face. The semiconductor package may further include a first redistribution pad exposed from the second face of the redistribution structure and a second redistribution pad exposed from the second face of the redistribution structure. The semiconductor package may further include a first solder ball being in contact with the first redistribution pad and a second solder ball being in contact with the second redistribution pad. In some embodiments, a first distance of the first redistribution pad is smaller than a second distance of the second redistribution pad, the first and second distances are measured with respect to a reference plane that intersects a lower portion of the first solder ball and a lower portion of the second solder ball.

20 Claims, 15 Drawing Sheets

(56) References Cited

U.S. PATENT DOCUMENTS

| | | | |
|---|---|---|---|
| 9,679,862 | B2 | 6/2017 | Lin et al. |
| 9,842,818 | B2 | 12/2017 | Li et al. |
| 9,881,889 | B2 | 1/2018 | Huang et al. |
| 2017/0103958 | A1 | 4/2017 | Lee et al. |
| 2019/0043817 | A1 | 2/2019 | Kadade et al. |

* cited by examiner

SEMICONDUCTOR PACKAGE

This application claims priority to Korean Patent Application No. 10-2019-0100932, filed on Aug. 19, 2019, and all the benefits accruing therefrom under 35 U.S.C. § 119, the disclosure of which is incorporated herein by reference in its entirety.

BACKGROUND

1. Technical Field

The present inventive concept relates to a semiconductor package. More specifically, the present inventive concept relates to a semiconductor package including a redistribution structure.

2. Description of the Related Art

Semiconductor packaging is a process of packaging a semiconductor chip to electrically connect the semiconductor chip (or a semiconductor die) and an electronic device. As the size of the semiconductor chip decreases, a semiconductor package in which input/output terminals are arranged outside the semiconductor chip using the redistribution layer has been proposed. For example, a fan-in wafer level package (FIWLP) type semiconductor package, a fan-out wafer level package (FOWLP) type semiconductor package, a fan-out panel level package (FOPLP) type semiconductor package, and the like have been proposed.

Since the semiconductor package including the redistribution layer has a simple packaging process and may achieve a thin thickness, it has advantages which are favorable for downsizing and thinning and may even have excellent thermal and electrical characteristics. On the other hand, the semiconductor package including the redistribution layer may include a packaging technique for mounting a semiconductor chip on a mainboard or the like of an electronic device to protect the semiconductor chip from external impact, and is a concept that is different in scale, usage, and the like from an printed circuit board (PCB) such as an interposer substrate.

SUMMARY

Aspects of the present inventive concept provide a semiconductor package with improved connection reliability.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor package including a redistribution structure including a first face and a second face opposite to each other and a first semiconductor chip mounted on the first face of the redistribution structure. The semiconductor package may further include a first redistribution pad exposed from the second face of the redistribution structure and having a first width and a second redistribution pad exposed from the second face of the redistribution structure and having a second width smaller than the first width of the first redistribution pad. The semiconductor package may further include a first solder ball being in contact with the first redistribution pad and having a third width and a second solder ball being in contact with the second redistribution pad and having a fourth width smaller than the third width of the first solder ball. In some embodiments, a first distance of the first redistribution pad is smaller than a second distance of the second redistribution pad, the first and second distances are measured with respect to a reference plane that intersects a lower portion of the first solder ball and a lower portion of the second solder ball.

According to an aspect of the present inventive concept, there is provided a semiconductor package including a redistribution structure including a first face, and a second face which is opposite to the first face and concave downward. The semiconductor package may further include a semiconductor chip mounted on the first face of the redistribution structure and a first redistribution pad exposed from the second face of the redistribution structure and having a first width and a second redistribution pad which is spaced apart from an edge of the redistribution structure further than the first redistribution pad, is exposed from the second face of the redistribution structure, and has a second width smaller than the first width of the first redistribution pad. The semiconductor package may further include a first solder ball which is in contact with the first redistribution pad and has a third width and a first height and a second solder ball which is in contact with the second redistribution pad and has a fourth width smaller than the third width of the first solder ball and a second height larger than the first height of the first solder ball.

According to an aspect of the present inventive concept, there is provided a semiconductor package mounted on a mainboard that includes a redistribution structure which includes a plurality of insulating layers including a photo-imageable dielectric (PID), a plurality of redistribution layers in the insulating layers, and a plurality of vias penetrating the insulating layers to connect the redistribution layers to each other. The redistribution structure including a first face and a second face opposite to each other. The semiconductor package may further include a semiconductor chip mounted on the first face of the redistribution structure and a molding part which covers at least a portion of the semiconductor chip on the first face of the redistribution structure. The semiconductor chip may further include a first redistribution pad exposed from the second face of the redistribution structure and having a first width, and a second redistribution pad exposed from the second face of the redistribution structure and having a second width smaller than the first width of the first redistribution pad. The semiconductor package may further include a first solder ball being in contact with the first redistribution pad and the mainboard and having a third width, and a second solder ball being in contact with the second redistribution pad and the mainboard, and having a fourth width smaller than the third width of the first solder ball. In some embodiments, a first distance of the first redistribution pad is smaller than a second distance of the second redistribution pad, and the first and second distances are measured with respect to an upper face of the mainboard.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
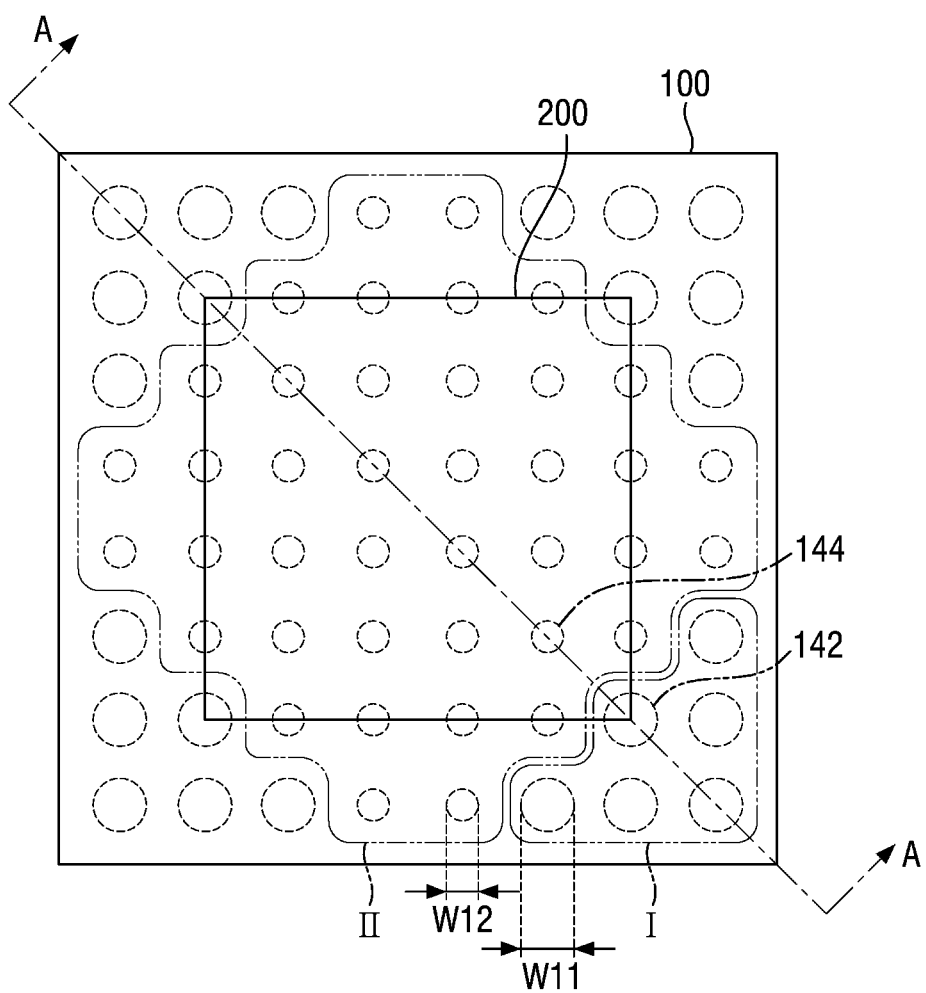
FIG. 1 is a schematic layout diagram for explaining a semiconductor package according to some embodiments.

Hereinafter, semiconductor packages according to some embodiments will be described with reference to FIGS. 1 through 15.

In the drawings related to the semiconductor packages according to some embodiments, although a fan-out wafer level package (FOWLP) type semiconductor package has been shown as an example, the present disclosure is not limited thereto. For example, the semiconductor package according to some embodiments may, of course, be another type of semiconductor package in which a bottom surface thereof has a redistribution structure, such as a fan-in wafer lever package (FIWLP) type semiconductor package, and a fan-out panel level package (FOPLP) type semiconductor package.

Figure 2:
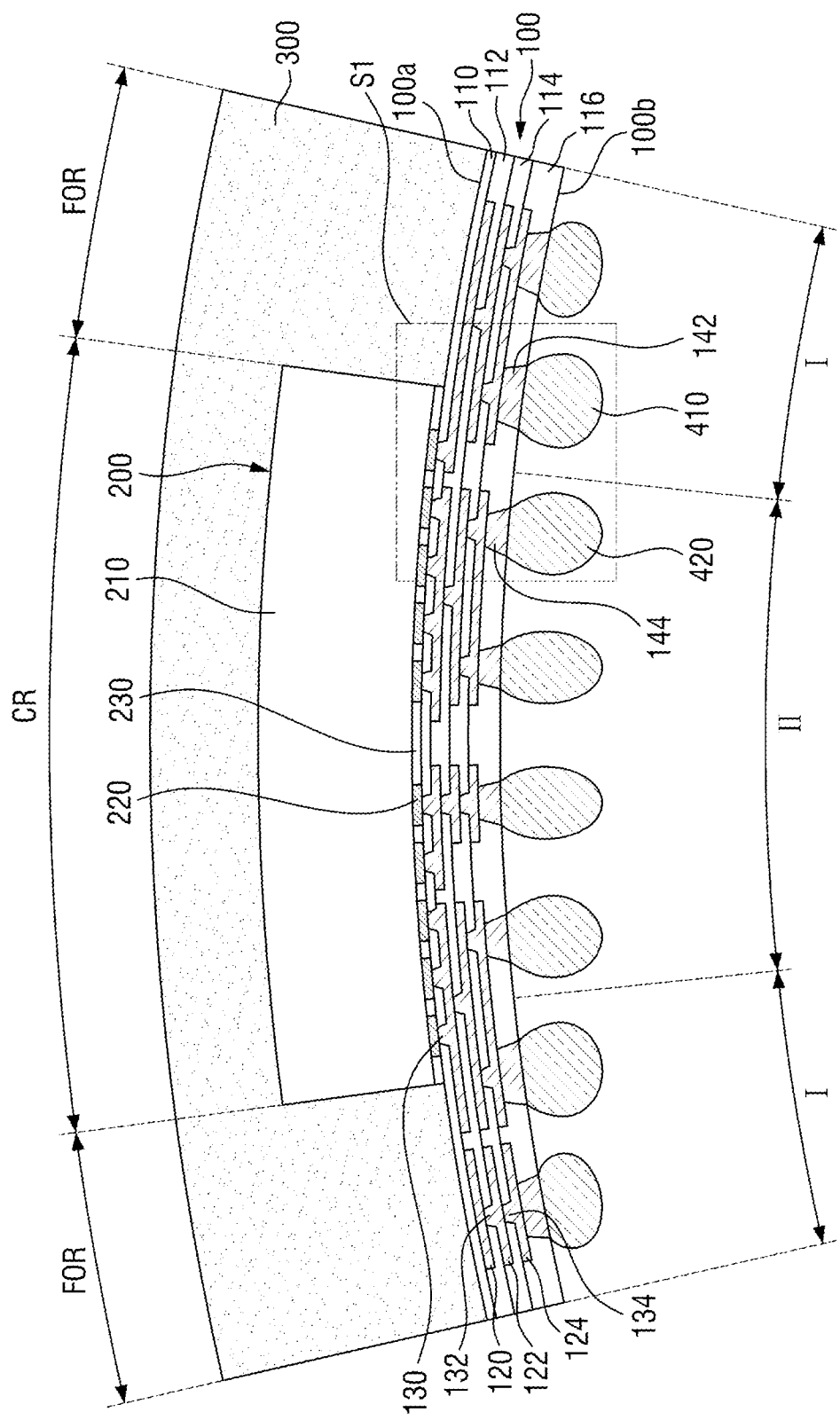
FIG. 2 is a schematic cross-sectional view taken along a line A-A of FIG. 2.
Figure 3:
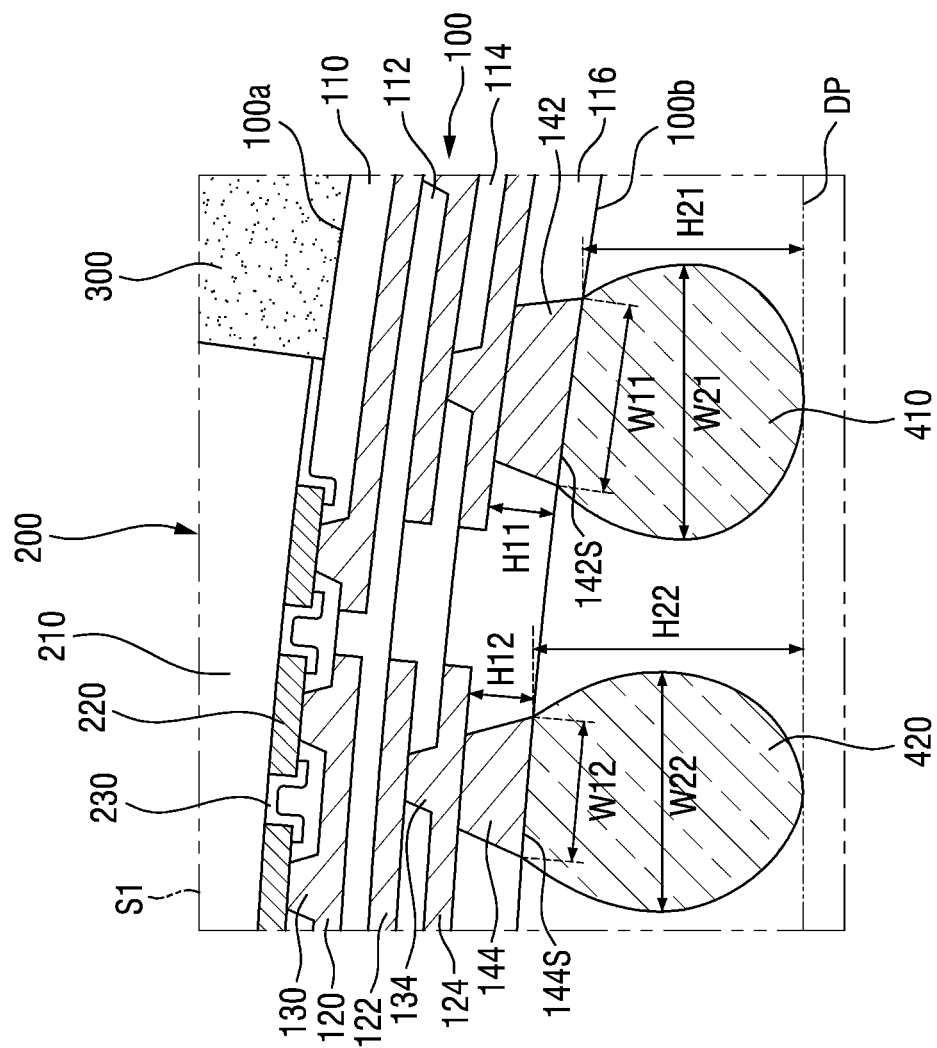
FIGS. 3 and 4 are various enlarged views of a region S1 of FIG. 2.
Figure 4:
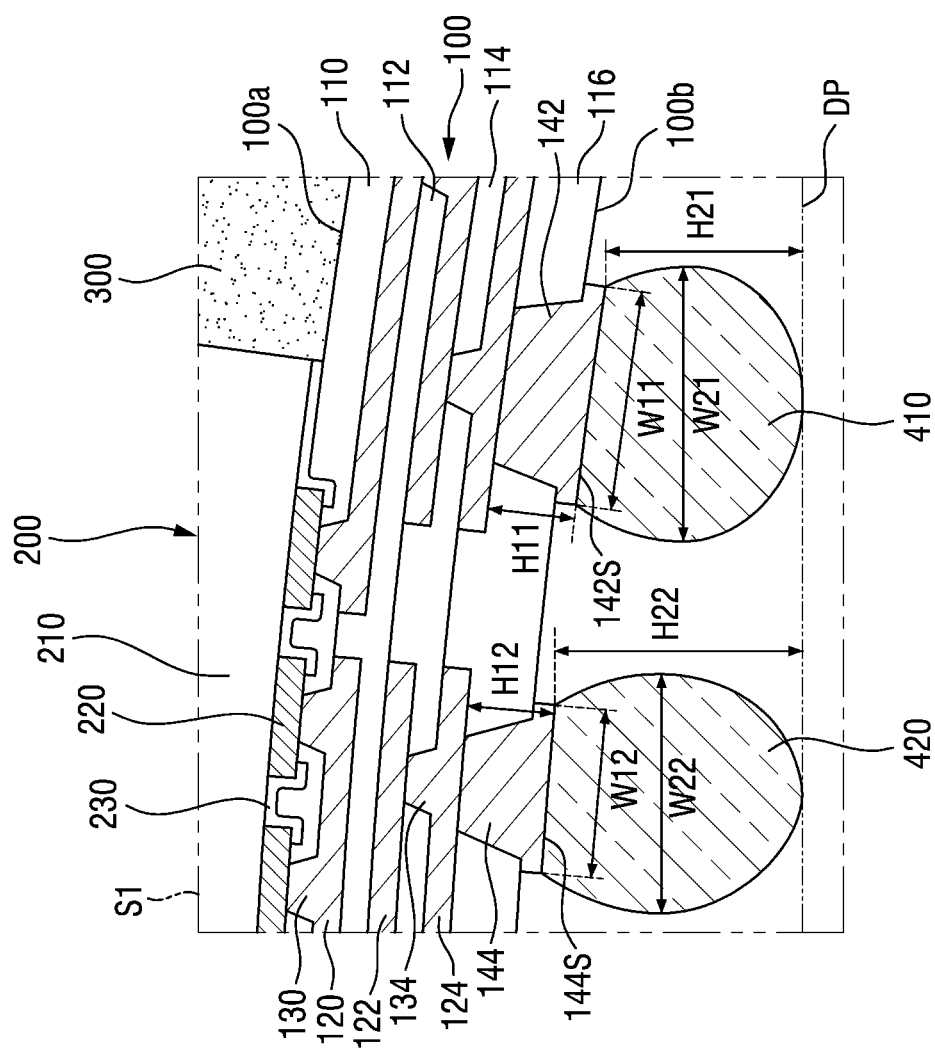

FIG. 1 is a schematic layout diagram for explaining a semiconductor package according to some embodiments. FIG. 2 is a schematic cross-sectional view taken along a line A-A of FIG. 2. FIGS. 3 and 4 are various enlarged views of a region S1 of FIG. 2.

Referring to FIGS. 1 to 4, the semiconductor package according to some embodiments includes a redistribution structure 100, a first semiconductor chip 200, a first redistribution pad 142, a second redistribution pad 144, a first solder ball 410, a second solder ball 420 and a molding part 300.

The redistribution structure 100 may include a first face 100a and a second face 100b that are opposite to each other. For example, in FIG. 2, the first face 100a may be an upper face of the redistribution structure 100, and the second face 100b may be a lower face of the redistribution structure 100.

The redistribution structure 100 may include a plurality of insulating layers 110, 112, 114, and 116, a plurality of redistribution layers 120, 122, and 124 and a plurality of vias 130, 132 and 134.

For example, the redistribution structure 100 may include first to fourth insulating layers 110, 112, 114, and 116 that are sequentially stacked in a direction from the first face 100a to the second face 100b. Although the redistribution structure 100 is shown to include only four insulating layers, this is only an example, and the number of insulating layers 110, 112, 114, and 116 may be different.

Each of the insulating layers 110, 112, 114, and 116 may include, for example, a PhotoImageable Dielectric (PID). The photoimageable dielectric may be subjected to a photolithography process and may be fabricated at a wafer level. As a result, when each of the insulating layers 110, 112, 114, and 116 includes the photoimageable dielectric, each of the insulating layers 110, 112, 114, and 116 may be formed to be relatively thinner, and redistribution layers 120, 122, and 124 and vias 130, 132, and 134, which will be described later, may be formed with a relatively finer pitch.

The insulating layers 110, 112, 114, and 116 may include the same material as each other or may include different materials from each other. In FIGS. 2 to 4, although boundaries of the respective insulating layers 110, 112, 114, and 116 are shown, this is only for convenience of explanation. For example, boundaries between the insulating layers 110, 112, 114, and 116 may be uncertain and/or different, depending on the process of forming the insulating layers 110, 112, 114, and 116 or the material constituting the insulating layers 110, 112, 114, and 116.

A plurality of redistribution layers 120, 122, and 124 may be formed in the insulating layers 110, 112, 114, and 116. For example, the redistribution structure 100 may include first to third redistribution layers 120, 122, and 124 that are sequentially stacked in a direction from the first face 100a to the second face 100b. For example, the first redistribution layer 120 may be formed in the second insulation layer 112, the second redistribution layer 122 may be formed in the third insulation layer 114, and the third redistribution layer 124 may be formed in the fourth insulating layer 116. However, the redistribution layers 120, 122, and 124 shown are only an example, and the number, position or arrangement of the redistribution layers 120, 122, and 124 may, of course, be different.

Although the redistribution layers 120, 122, and 124 are shown to have the same size and/or thickness as each other, this is only for convenience of explanation. For example, the thickness of the redistribution layers 120, 122, and 124 may increase from the first face 100a toward the second face 100b. Specifically, unlike the shown case, the thickness of the second redistribution layer 122 may be thicker (greater) than the thickness of the first redistribution layer 120, and the thickness of the third redistribution layer 124 may be thicker (greater) than the thickness of the second redistribution layer 122.

Each of the redistribution layers 120, 122, and 124 may include a conductive material. Therefore, the redistribution layers 120, 122, and 124 may redistribute a chip pad 220 of a first semiconductor chip 200 to be described later. For example, each of the redistribution layers 120, 122, and 124 may include, but is not limited to, at least one of copper (Cu), aluminum (Al), silver (Ag), tin (Sn), gold (Au), nickel (Ni), lead (Pb), titanium (Ti) and alloys thereof.

The redistribution layers 120, 122, and 124 may perform various functions depending on the planned designs of the layers. For example, the redistribution layers 120, 122, and 124 may include a ground pattern, a power pattern, a signal pattern, and the like. The signal pattern may input and output various electric signals, for example, data electric signals, except a ground signal, a power signal or the like.

A plurality of vias 130, 132, and 134 may penetrate the insulating layers 110, 112, 114, and 116, and interconnect the redistribution layers 120, 122, and 124. For example, the redistribution structure 100 may include first to third vias 130, 132, and 134. For example, the first via 130 may penetrate the first insulating layer 110 and be connected to the first redistribution layer 120, the second via 132 may penetrate the second insulating layer 112 to connect the first redistribution layer 120 and the second redistribution layer 122, and the third via 134 may penetrate the third insulating layer 114 to connect the second redistribution layer 122 and the third redistribution layer 124. However, the vias 130, 132, and 134 shown are merely an example, and the number, position or arrangement of the vias 130, 132 and 134 may, of course, be different.

Although the vias 130, 132, and 134 are shown to have the same size as each other, this is only for convenience of explanation. For example, the widths of the vias 130, 132, and 134 may increase from the first face 100a toward the second face 100b. Specifically, unlike the shown case, the width of the second via 132 may be larger than the width of the first via 130, and the width of the third via 134 may be larger than the width of the second via 132.

Also, although each of the vias 130, 132, and 134 is shown to completely fill trenches inside the insulating layers 110, 112, 114, and 116, this is only an example. For example, unlike the shown case, each of the vias 130, 132, and 134 may have a shape that extends along profiles of trenches (e.g., a conforming shape) inside the insulating layers 110, 112, 114, and 116.

Each of the vias 130, 132, and 134 may include a conductive material. Therefore, an electrical path which connects the first face 100a and the second face 100b may be formed in the redistribution structure 100. For example, each of the vias 130, 132, and 134 may include, but is not limited to, at least one of copper (Cu), aluminum (Al), silver (Ag), tin (Sn), gold (Au), nickel (Ni), lead (Pb), titanium (Ti) and alloys thereof.

The first semiconductor chip 200 may be mounted on the first face 100a of the redistribution structure 100. In some embodiments, the redistribution structure 100 may include a chip region (CR) on which the first semiconductor chip 200 is mounted, and a fan-out region (FOR) around the chip region CR. The chip region CR is a region of the first semiconductor chip 200 that overlaps the redistribution structure 100, and the fan-out region FOR may be a remaining region of the redistribution structure 100 excluding the chip region CR. For example, the fan-out region FOR may be a region of the redistribution structure 100 that does not overlap the first semiconductor chip 200. Here, the term "overlap" means an overlap in a direction intersecting the first face 100a. In some embodiments, the fan-out region FOR may be arranged to surround the chip region CR.

The semiconductor package including the fan-out region FOR has advantages in which reliability is superior to a fan-in package, a large number of input/output I/O terminals can be implemented, and a 3D interconnection is relatively easy. In addition, since the semiconductor package including the fan-out region FOR has a relatively thinner package thickness compared to a ball grid array (BGA) package, a land grid array (LGA) package, and the like, it has advantages that are favorable for downsizing and thinning, in addition to excellent price competitiveness and excellent thermal and electrical characteristics.

The first semiconductor chip 200 may be an integrated circuit (IC) in which several hundred to several million or more semiconductor elements are integrated in a single chip. For example, the first semiconductor chip 200 may be, but is not limited to, an application processor (AP), such as a central processing unit (CPU), a graphic processing unit (GPU), a field-programmable gate array (FPGA), a digital signal processor, an encryption processor, a microprocessor, and a microcontroller. For example, the first semiconductor chip 200 may be a logic chip such as an analog-digital converter (ADC) or an application-specific IC (ASIC), or may be a memory chip such as a volatile memory (e.g., DRAM) or a non-volatile memory (e.g., a ROM or a flash memory). Further, the first semiconductor chip 200 may, of course, be configured by any combination thereof.

In some embodiments, the first semiconductor chip 200 may be formed on the basis of a wafer. For example, the first semiconductor chip 200 may include a body 210, a chip pad 220, and a passivation film 230.

Various semiconductor elements may be formed in the body 210. The body 210 may include, for example, bulk silicon or silicon-on-insulator (SOI). The body 210 may be a silicon substrate, or may include, but is not limited to, other materials, for example, silicon germanium, silicon germanium on insulator (SGOI), indium antimonide, lead tellurium compound, indium arsenide, indium phosphide, gallium arsenide or gallium antimonide.

The chip pad 220 may be formed on the surface of the body 210. The chip pad 220 may be electrically connected to an electrical circuit formed in the body 210, for example, a circuit pattern or the like. The chip pad 220 may include, for example, but is not limited to, aluminum (Al).

The chip pad 220 may be connected to the redistribution structure 100. Therefore, the first semiconductor chip 200 may be electrically connected to the redistribution structure 100. For example, the first via 130 of the redistribution structure 100 may be formed to penetrate the first insulating layer 110 and be connected to the chip pad 220. The chip pad 220 may be redistributed by the redistribution structure 100.

The passivation film 230 may be formed on the surface of the body 210. Further, the passivation film 230 may expose at least a portion of the chip pad 220. For example, as shown in FIGS. 3 and 4, the passivation film 230 may be formed to cover a portion of the chip pad 220. The passivation film 230 may include, for example, but is not limited to, an oxide film or a nitride film.

In some embodiments, the first semiconductor chip 200 may be a bare die, for example.

The first redistribution pad 142 and the second redistribution pad 144 may be exposed from the second face 100b of the redistribution structure 100, respectively. For example, as shown in FIGS. 3 and 4, the first redistribution pad 142 may include a first contact face 142S exposed from the second face 100b of the redistribution structure 100, and the second redistribution pad 144 may include a second contact face 144S exposed from the second face 100b of the redistribution structure 100. Also, the first redistribution pad 142 and the second redistribution pad 144 may be spaced apart from each other.

On the other hand, in some embodiments, as shown in FIG. 3, the first contact face 142S of the first redistribution pad 142 and the second contact face 144S of the second redistribution pad 144 may be arranged on the same plane as the second face 100b of the redistribution structure 100.

In contrast, in some embodiments, as shown in FIG. 4, the first contact face 142S of the first redistribution pad 142 and the second contact face 144S of the second redistribution pad 144 may protrude from the second face 100b of the redistribution structure 100. In some embodiments, the first contact face 142S of the first redistribution pad 142 and the second contact face 144S of the second redistribution pad 144 may be formed to cover a portion of the second face 100b of the redistribution structure 100.

The first redistribution pad 142 and the second redistribution pad 144 may be electrically connected to the redistribution structure 100, respectively. For example, the first redistribution pad 142 and the second redistribution pad 144 may be formed to penetrate the fourth insulating layer 116 and be connected to the third redistribution layer 124.

In some embodiments, the first redistribution pad 142 and the second redistribution pad 144 may be formed at the same level with respect to an external major surface (e.g., contact face 100a or second contact face 144S) (e.g., at the same distance from contact face 100a, and/or second contact face 144S as measured along corresponding directions perpendicular to the corresponding contact face). The first redistribution pad 142 and the second redistribution pad 144 may be formed using the same fabricating process, such as being formed from the same material layer(s) (e.g., patterned or molded from a material layer(s) deposited in the same fabricating process(es)). Additionally, first redistribution pad 142 and second redistribution pad 144 may be formed on and conform to the same layer and/or surface, e.g., 100b. In some embodiments, a thickness H11 of the first redistribution pad 142 may be the same as a thickness H12 of the second redistribution pad 144. For example, a thickness H11, H12 may be measured from a contact face 142S, 144S to the corresponding redistribution structure. For example, a thickness H12 may be measured along a direction of a perpendicular line extending from second contact face 144S to redistribution structure 124.

The first redistribution pad 142 and the second redistribution pad 144 may have different widths from each other. Here, the width may be defined by the width of the first contact face 142S and the width of the second contact face 144S. For example, as shown in FIGS. 1, 3, and 4, a width W11 of the first redistribution pad 142 may be greater than a width W12 of the second redistribution pad 144.

The first redistribution pad 142 and the second redistribution pad 144 may be exposed from different regions of the redistribution structure 100 from each other. For example, as shown in FIGS. 1 and 2, the second face 100b of the redistribution structure 100 may include a first region I and a second region II that are different from each other. In some embodiments, a first region I may include a plurality of first redistribution pads 142 and the second region II may include a plurality of second redistribution pads 144. Although the written description herein, may refer to first redistribution pad 142 and second redistribution pad 144 in the singular form, it shall be understood that a plurality of the same is also contemplated by this disclosure. Likewise, as used herein, the singular forms "a", "an" and "the" are intended to include the plural forms as well, unless the context clearly indicates otherwise. At this time, the first redistribution pad 142 may be arranged in the first region I, and the second redistribution pad 144 may be arranged in the second region II. It is a matter of course that a plurality of first redistribution pads 142 may be arranged in the first region I, and a plurality of second redistribution pads 144 may be arranged in the second region II.

In some embodiments, the first region I may be adjacent to a corner of the redistribution structure 100. At this time, the second region II may be a remaining region of the redistribution structure 100, which does not include the first region I. In such a case, at least a portion of the second redistribution pad 144 may be spaced apart from an edge of the redistribution structure 100 further than the first redistribution pad 142. For example, as shown in FIG. 2, the second redistribution pad 144 may be spaced farther apart from the edge of the redistribution structure 100 than the first redistribution pad 142. For example, the first redistribution pad 142 may be closer to an edge and/or corner of the redistribution 100 than the second redistribution pad 144.

In some embodiments, at least some of the plurality of first redistribution pads 142 or at least some of the plurality of second redistribution pads 144 may be formed in the fan-out region (FOR). For example, as shown in FIG. 2, some of the first redistribution pads 142 may be formed in the fan-out region FOR, and some of the second redistribution pads 144 may be formed in the chip region (CR).

The first solder ball 410 may be formed on the first redistribution pad 142. Also, the first solder ball 410 may be in contact with the first redistribution pad 142. For example, an upper portion of the first solder ball 410 may be in contact with the first contact face 142S of the first redistribution pad 142. Therefore, the first solder ball 410 may be electrically connected to the redistribution structure 100.

The second solder ball 420 may be formed on the second redistribution pad 144. Also, the second solder ball 420 may be in contact with the second redistribution pad 144. For example, an upper portion of the second solder ball 420 may be in contact with the second contact face 144S of the second redistribution pad 144. Accordingly, the second solder ball 420 may be electrically connected to the redistribution structure 100.

The first solder ball 410 and the second solder ball 420 may define a reference plane DP. The reference plane DP may be defined as a plane that is spaced apart from the first redistribution pad 142 and the second redistribution pad 144, and is in contact with both the first solder ball 410 and the second solder ball 420. For example, as shown in FIGS. 3 and 4, the reference plane DP may be a plane that is in contact with both a lower portion of the first solder ball 410 and a lower portion of the second solder ball 420. In some embodiments, the reference plane DP may connect a lowest portion of the first solder ball 410 and a lowest portion of the second solder ball 420. For example, the reference plane DP may be a plane that intersects (1) the bottom of the first solder ball 410 at a single point and (2) the bottom of the second solder ball 420 at a single outermost point. For example, a bottom of the first solder ball 410 corresponds to the portion of the first solder ball 410 opposite from the first redistribution pad 142 and a bottom of the second solder ball 420 corresponds to the portion of the second solder ball 420 opposite from the second redistribution pad 144. Additionally, in this way the first and second solder balls 410, 420 may be coplanar with one another at their respective bottom portions but not necessarily at their respective upper portions.

In some embodiments, the first redistribution pad 142 and the second redistribution pad 144 may be spaced apart at different distances from the reference plane DP. For example, a first distance of the first redistribution pad 142 from the reference plane DP may be smaller than (less than) a second distance of the second redistribution pad 144 from the reference plane DP. Also, the first and second distances noted above may be measured by a perpendicular line extending from the reference plane DP to the nearest point of the corresponding redistribution pad 142, 144 where it contacts the corresponding contact face 142S, 144S.

As described above, the lower portion of the first solder ball 410 may define the reference plane DP, and the upper portion of the first solder ball 410 may be in contact with the first redistribution pad 142. Similarly, the lower portion of the second solder ball 420 may define the reference plane DP, and the upper portion of the second solder ball 420 may be in contact with the second redistribution pad 144. That is, the first solder ball 410 may extend from the reference plane DP to the first redistribution pad 142, and the second solder ball 420 may extend from the reference plane DP to the second redistribution pad 144. Therefore, the height H21 of the first solder ball 410 may be smaller than the height H22 of the second solder ball 420.

In some embodiments, the width W21 of the first solder ball 410 may be greater than the width W22 of the second solder ball 420. Here, the width means a width in a direction parallel to the reference plane DP. In some embodiments, a maximum width of the first and second solder balls 410, 420 may refer to the distance (in a direction parallel to the reference plane DP) where the solder ball is widest.

In some embodiments, a volume of the first solder ball 410 may be the same as a volume of the second solder ball 420. In this specification, the term "same" means not only the completely same thing (e.g., identical) but also may encompass a minute difference that may occur due to a manufacturing process or the like. At this time, since the height H21 of the first solder ball 410 may be smaller than the height H22 of the second solder ball 420, the width W21 of the first solder ball 410 may be greater than the width W22 of the second solder ball 420.

The first solder ball 410 and the second solder ball 420 may each include a material made up of a solder. For example, the first solder ball 410 and the second solder ball 420 may include, but is not limited to, at least one of lead (Pb), tin (Sn), indium (In), bismuth (Bi), antimony (Sb), silver (Ag) and alloys thereof.

The molding part 300 may be formed on the first face 100a of the redistribution structure 100. The molding part 300 may cover at least a portion of the first semiconductor chip 200. Moreover, the molding part 300 may cover the fan-out region FOR of the redistribution structure 100.

In FIG. 2, the molding part 300 is shown to cover both the side face and the upper face of the first semiconductor chip 200, but this is merely an example. For example, the molding part 300 may cover the side face of the first semiconductor chip 200 and may expose the upper face of the first semiconductor chip 200.

In some embodiments, the side face of the molding part 300 may be continuous with the side face of the redistribution structure 100. This may be attributed to the characteristics of the process of forming the molding part 300. For example, the molding part 300 and the redistribution structure 100 may be cut at the same time, by a singulation process of dividing a plurality of semiconductor chips individually. Therefore, the side face of the molding part 300 and the side face of the redistribution structure 100 may be formed continuously.

The molding part 300 may include an insulating material. For example, the molding part 300 may include a thermosetting resin such as an epoxy resin, a thermoplastic resin such as polyimide, or plural resins (for example, a prepreg, an ABF (Ajinomoto Build-up Film), a FR-4, a BT (Bismaleimide Triazine)) in which these resins are mixed with an inorganic filler or impregnated in a core material such as a glass fiber (glass fiber, glass cloth, glass fabric) together with the inorganic filler and the like. Alternatively, the molding part 300 may include a photoimageable dielectric (PID).

As semiconductor packages become gradually smaller, defects such as a warpage may occur during the fabricating process. Such a warpage may be attributed to the fact that various materials constituting the semiconductor package have coefficients of thermal expansion (CTE) that are different from each other. For example, as shown in FIG. 2, since the warpage occurs in the semiconductor package according to some embodiments, the second face 100b of the redistribution structure 100 may form a curved surface, e.g., the second face 100b has a curvilinear profile. Also, in some embodiments the first face 100a may have a curvilinear profile. For example, the second face 100b of the redistribution structure 100 may be concave downward. Such a warpage may cause a connection failure between the semiconductor package and an electronic device (for example, a mainboard/motherboard) on which the semiconductor package is mounted.

However, the semiconductor package according to some embodiments may improve connection reliability, by using the first redistribution pad 142 and the second redistribution pad 144 having different widths in different regions.

For example, when the second face 100b of the redistribution structure 100 is concave, the second redistribution pad 144 spaced apart from the edge of the redistribution structure 100 further than the first redistribution pad 142 may have a width W12 smaller than the width W11 of the first redistribution pad 142. At this time, as described above, a height H22 of the second solder ball 420 connected to the second redistribution pad 144 may be formed to be larger than a height H21 of the first solder ball 410 connected to the first redistribution pad 142. As a result, coplanarity of the lowermost portion of the first solder ball 410 and the lowermost portion of the second solder ball 420 is improved, and a semiconductor package with improved connection reliability can be provided.

In some embodiments, the width of each of the vias 130, 132, and 134 may gradually decrease in a direction from the second face 100b toward the first face 100a. For example, the semiconductor package according to some embodiments may be formed by an RDL last process. In such a case, the redistribution structure 100 may be formed by being stacked on the surface of the first semiconductor chip 200 (on which the chip pad 220 is formed) and the surface of the molding part 300. For example, the first to fourth insulating layers 110, 112, 114, and 116 may be formed by being sequentially stacked in a direction from the first face 100a toward the second face 100b.

For example, the first via 130 may be formed through an etching process of removing a portion of the first insulating layer 110 to expose a portion of the chip pad 220. As a result, the width of the first via 130 may gradually decrease in the direction toward the first face 100a.

In some embodiments, the width of the first redistribution pad 142 and the width of the second redistribution pad 144 may gradually decrease in the direction from the second face 100b toward the first face 100a. For example, the semiconductor package according to some embodiments may be formed by the RDL last process described above. In such a case, the first redistribution pad 142 and the second redistribution pad 144 may be formed after the redistribution structure 100 is formed.

For example, the first redistribution pad 142 and the second redistribution pad 144 may be formed through an etching process of removing a portion of the fourth insulating layer 116 to expose a portion of the third redistribution layer 124. Therefore, the width of the first redistribution pad 142 and the width of the second redistribution pad 144 may gradually decrease in the direction toward the first face 100a.

Figure 5:
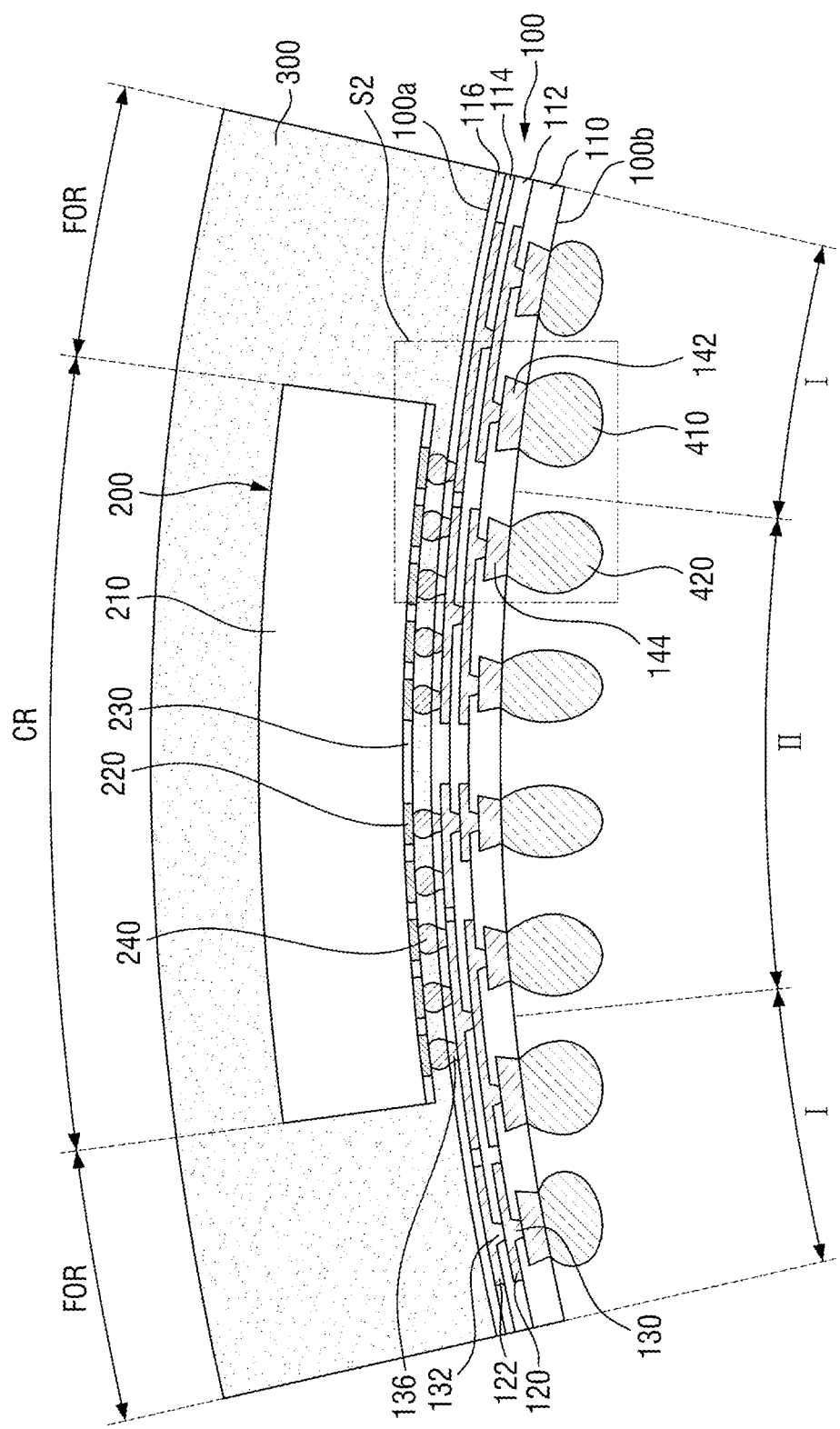
FIG. 5 is a schematic cross-sectional view for explaining a semiconductor package according to some embodiments.
Figure 6:
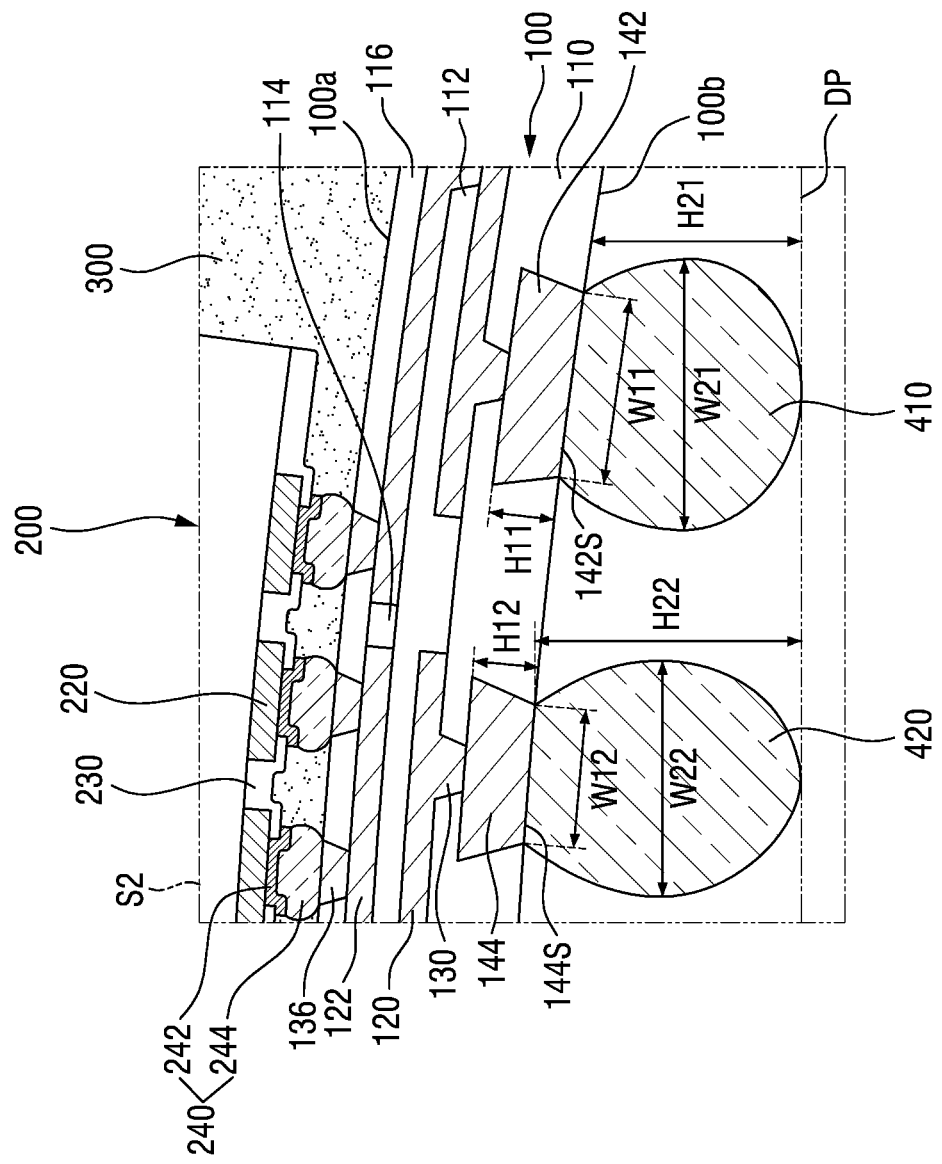
FIGS. 6 and 7 are various enlarged views of a region S2 of FIG. 5.
Figure 7:
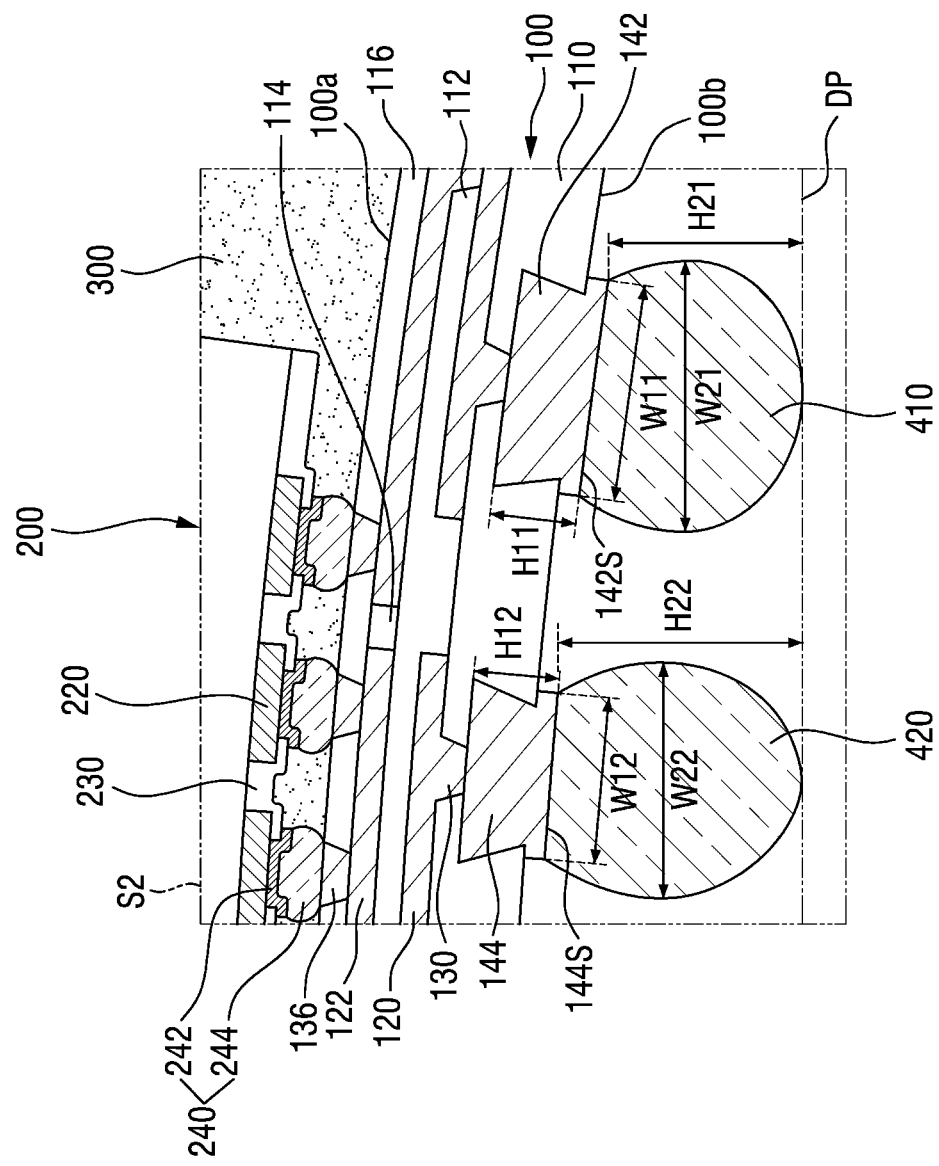

FIG. 5 is a schematic cross-sectional view for explaining a semiconductor package according to some embodiments. FIGS. 6 and 7 are various enlarged views of a region S2 of FIG. 5. For convenience of explanation, repeated parts of the contents described above with respect to FIGS. 1 through 4 will be briefly described or omitted.

Referring to FIGS. 5 to 7, in the semiconductor package according to some embodiments, the widths of each of the vias 130, 132, and 134 gradually decrease in a direction from the first face 100a toward the second face 100b.

For example, the semiconductor package according to some embodiments may be formed by an RDL first process. In such a case, the redistribution structure 100 may be fixed by a wafer carrier or the like, and may be formed by being stacked from the second face 100b. For example, the first to fourth insulating layers 110, 112, 114, and 116 may be formed by being sequentially stacked in the direction from the second face 100b toward the first face 100a. Thereafter, the first semiconductor chip 200 may be mounted on the first face 100a of the redistribution structure 100.

For example, the first via 130 may be formed through an etching process of removing a portion of the first insulating layer 110 to expose a portion of the first redistribution pad 142 and a portion of the second redistribution pad 144. Therefore, the width of the first via 130 may gradually decrease in the direction toward the second face 100b.

In some embodiments, the width of the first redistribution pad 142 and the width of the second redistribution pad 144 may gradually decrease in the direction from the first face 100a toward the second face 100b. For example, the semiconductor package according to some embodiments may be formed by the RDL first process described above.

For example, the first redistribution pad 142 and the second redistribution pad 144 may be formed through an etching process of removing a portion of the first insulating layer 110 to expose a portion of the second face 100b. Therefore, the width of the first redistribution pad 142 and the width of the second redistribution pad 144 may gradually decrease in the direction toward the second face 100b.

Even in such a case, the first redistribution pad 142 and the second redistribution pad 144 may have widths that are different from each other. For example, as shown in FIGS. 6 and 7, the width W11 of the first redistribution pad 142 may be greater than the width W12 of the second redistribution pad 144.

In some embodiments, the first redistribution pad 142 and the second redistribution pad 144 may be disposed at different distances from the reference plane DP. For example, the first redistribution pad 142 and the second redistribution pad 144 may be disposed at different distances from each other when each distance is measured by a corresponding perpendicular line extending from the reference plane DP. For example, a first distance of the first redistribution pad 142 from the reference plane DP may be smaller than a second distance of the second redistribution pad 144 from the reference plane DP. Therefore, the height H21 of the first solder ball 410 may be smaller than the height H22 of the second solder ball 420.

In some embodiments, the width W21 of the first solder ball 410 may be greater than the width W22 of the second solder ball 420. In some embodiments, a volume of the first solder ball 410 may be the same as a volume of the second solder ball 420. Alternatively, a volume of the first solder ball 410 and a volume of the second solder ball 420 may be different, although they may still have a reference plane DP.

Meanwhile, in some embodiments, as shown in FIG. 6, a first contact face 142S of the first redistribution pad 142 and a second contact face 144S of the second redistribution pad 144 may be arranged on the same plane as the second face 100b of the redistribution structure 100. For example, as shown in FIG. 6, a first contact face 142S of the first redistribution pad 142 and a second contact face 144S of the second redistribution pad 144 may be arranged on the same curved profile as the second face 100b of the redistribution structure 100. For example, a first contact face 142S of the first redistribution pad 142 and a second contact face 144S of the second redistribution pad 144 may be continuous with the second face 100b of the redistribution structure 100.

In contrast, in some embodiments, as shown in FIG. 7, the first contact face 142S of the first redistribution pad 142 and the second contact face 144S of the second redistribution pad 144 may protrude outward from the second face 100b of the redistribution structure 100. Therefore, in the example embodiment of FIG. 7, the first contact face 142S of the first redistribution pad 142 and second contact face 144S of the second redistribution pad 144 are not continuous with the second face 100b of the redistribution structure 100. In some embodiments, the first contact face 142S of the first redistribution pad 142 and the second contact face 144S of the second redistribution pad 144 may be formed to cover a part of the second face 100b of the redistribution structure 100.

The semiconductor package according to some embodiments may further include a chip bump 240. The chip bump 240 may be formed on the chip pad 220. The chip bump 240 may be used as a conductive protrusion used for mounting the first semiconductor chip 200 on the redistribution structure 100. For example, the chip bump 240 may be used as a conductive protrusion which is in contact with the chip pad 220 and the third via 134 to electrically connect the first semiconductor chip 200 and the redistribution structure 100.

In some embodiments, the chip bump 240 may include a connection pattern 242 and a chip solder ball 244.

The connection pattern 242 may be in contact with the chip pad 220 which may be exposed by the passivation film 230. The connection pattern 242 may have, but is not limited to, a layer shape or a pillar shape. The connection pattern 242 may include, for example, but is not limited to, at least one of copper (Cu), nickel (Ni), tin (Sn), and alloys thereof.

The chip solder ball 244 may be formed on the connection pattern 242. The chip solder ball 244 may include a material made up of a solder. For example, the chip solder ball 244 may include, but is not limited to, at least one of lead (Pb), tin (Sn), indium (In), bismuth (Bi), antimony (Sb), silver (Ag), and alloys thereof.

Figure 8:
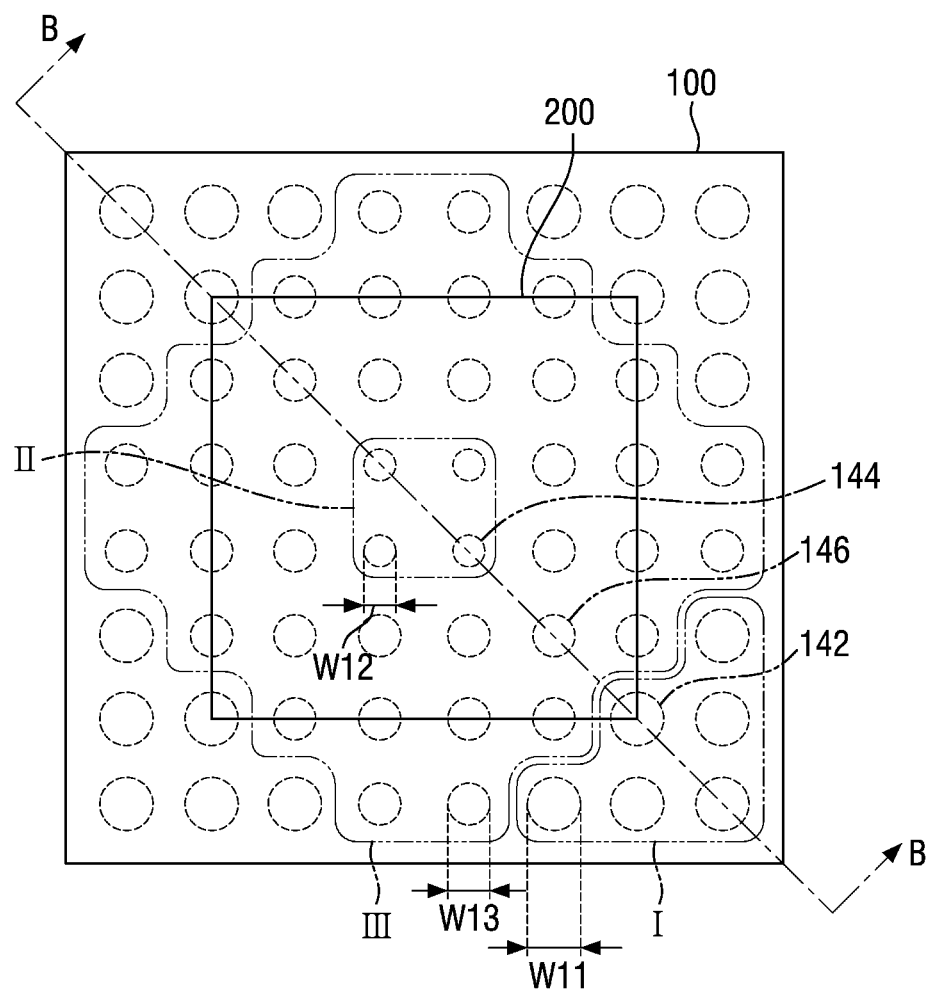
FIG. 8 is a schematic layout diagram for explaining a semiconductor package according to some embodiments.
Figure 9:
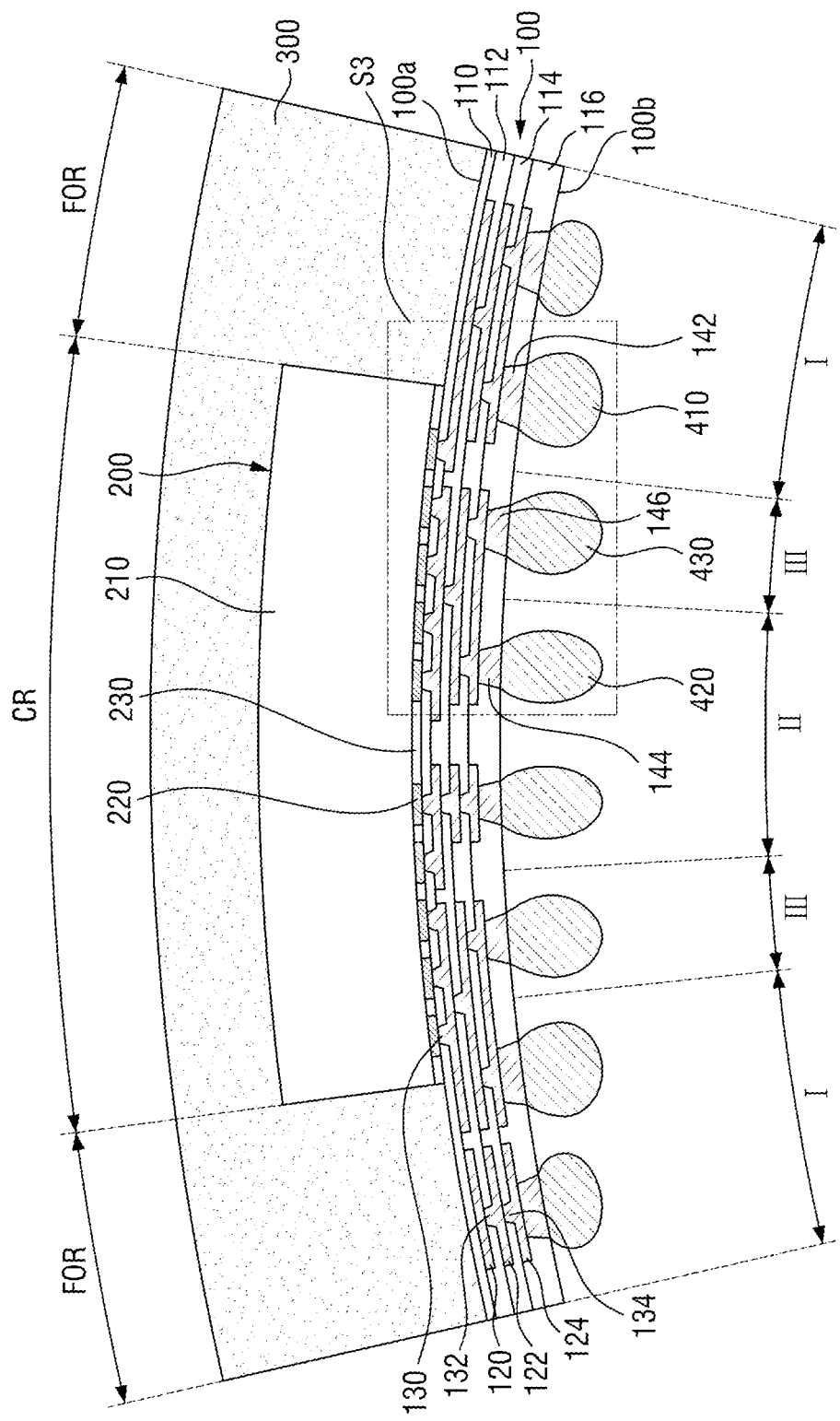
FIG. 9 is a schematic cross-sectional view taken along a line B-B of FIG. 8.
Figure 10:
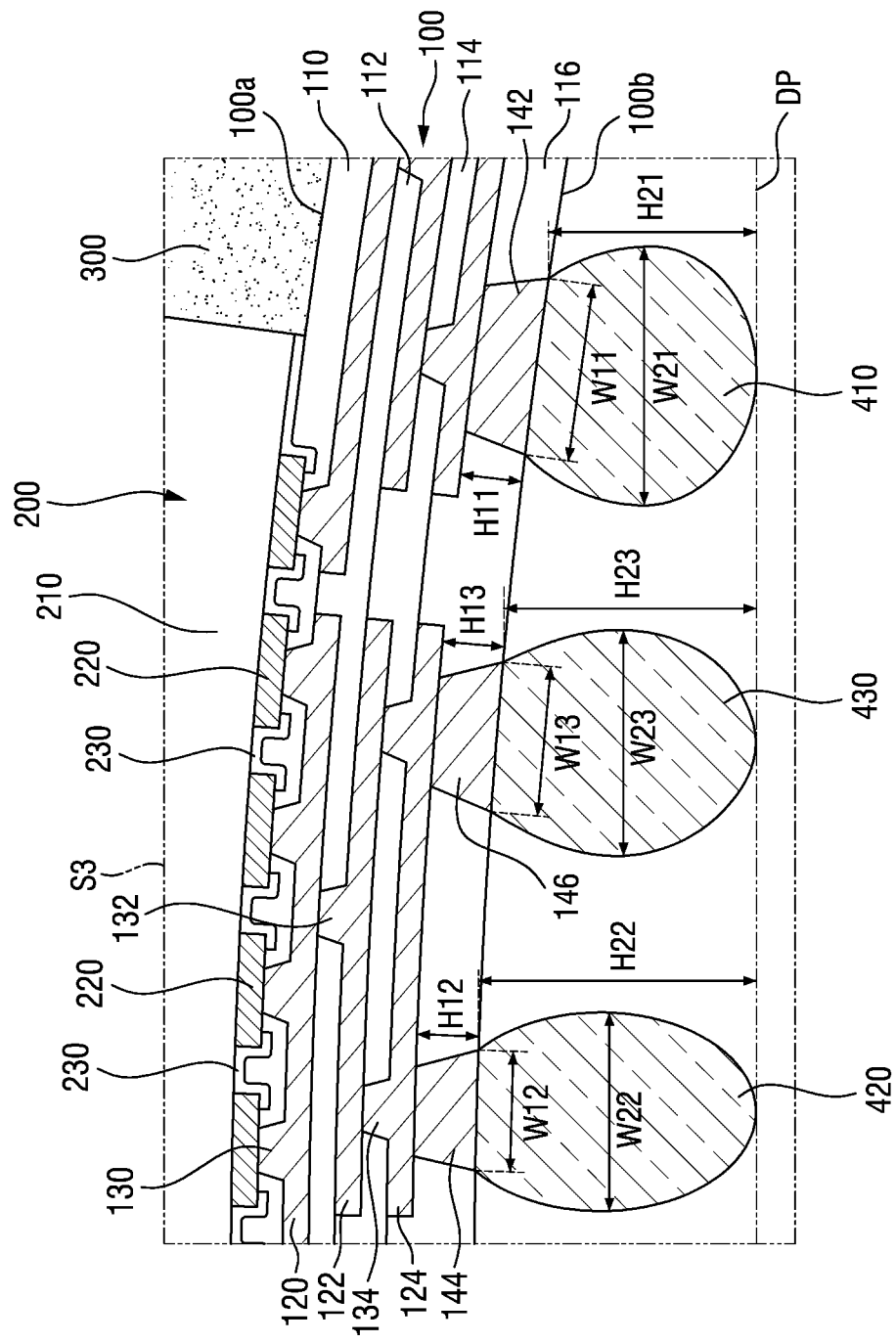
FIG. 10 is an enlarged view of a region S3 of FIG. 9.

FIG. 8 is a schematic layout diagram for explaining a semiconductor package according to some embodiments. FIG. 9 is a schematic cross-sectional view taken along a line B-B of FIG. 8. FIG. 10 is an enlarged view of a region S3 of FIG. 9. For convenience of explanation, repeated parts of the contents described above with reference to FIGS. 1 to 4 will be briefly described or omitted.

Referring to FIGS. 8 to 10, the semiconductor package according to some embodiments further includes a third redistribution pad 146 and a third solder ball 430.

The third redistribution pad 146 may be exposed from the second face 100b of the redistribution structure 100. Further, the third redistribution pad 146 may be spaced apart from the first redistribution pad 142 and the second redistribution pad 144.

The third redistribution pad 146 may be electrically connected to the redistribution structure 100. For example, the third redistribution pad 146 may be formed to penetrate the fourth insulating layer 116 and to be connected to the third redistribution layer 124.

In some embodiments, the third redistribution pad 146 may be formed at the same level as the first redistribution pad 142 and the second redistrubtion pad 144. In some embodiments, a thickness H13 of the third redistribution pad 146 may be the same as a thickness H11 of the first redistribution pad 142 and a thickness H12 of the second redistribution pad 144.

The third redistribution pad 146 may have a width different from those of the first redistribution pad 142 and the second redistribution pad 144. For example, as shown in FIGS. 8 and 10, a width W13 of the third redistribution pad 146 may be smaller than a width W11 of the first redistribution pad 142, and may be greater than a width W12 of the second redistribution pad 144. For example, a width W13 of the third redistribution pad 146 (where the third redistribution pad 146 contacts the third solder ball 430 may be smaller than a width W11 of the first redistribution pad 142 (where the first redistribution pad 142 contacts the first solder ball 410), and may be greater than a width W12 of the second redistribution pad 144 (where the second redistribution pad 144 contacts the second solder ball 420).

The third redistribution pad 146 may be exposed from regions of the redistribution structure 100 different from the first redistribution pad 142 and the second redistribution pad 144. For example, as shown in FIGS. 8 and 9, the second face 100b of the redistribution structure 100 may include first to third regions I, II, and III which are different from each other. At this time, the third redistribution pad 146 may be arranged in the third region III. A plurality of third redistribution pads 146 may of course be arranged in the third region III.

In some embodiments, the third region III may be interposed between the first region I and the second region II. In such a case, at least some of the third redistribution pad 146 may be spaced apart from the edge of the redistribution structure 100 further than the first redistribution pads 142. Additionally, the third redistribution pad 146 may be closer to the edge of the redistribution structure 100 than the second redistribution pad 144. For example, as shown in FIG. 9, the third redistribution pad 146 may be spaced apart from the edge of the redistribution structure 100 further than the first redistribution pad 142, and may be closer to the edge of the redistribution structure 100 than the second redistribution pad 144.

The third solder ball 430 may be formed on the third redistribution pad 146. Further, the third solder ball 430 may be in contact with the third redistribution pad 146. Therefore, the third solder balls 430 may be electrically connected to the redistribution structure 100.

In some embodiments, the third redistribution pad 146 may be spaced apart from the reference plane DP by a different distance than the first redistribution pad 142 and the second redistribution pad 144, when the distance is measured with respect to the reference plane DP. For example, a third distance of the third redistribution pad 146 from the reference plane DP may be greater than a first distance of the first redistribution pad 142 from the reference plane DP, and may be smaller than a second distance of the second redistribution pad 144 from the reference plane DP.

In some embodiments, the height H23 of the third solder ball 430 may be greater than the height H21 of the first solder ball 410, and may be smaller than the height H22 of the second solder ball 420 (when measured from the reference plane DP). For example, the reference plane DP may be a plane that passes across the lower portion of the first solder ball 410, the lower portion of the second solder ball 420, and the lower portion of the third solder ball 430.

In some embodiments, a width W23 of the third solder ball 430 may be smaller than a width W21 of the first solder ball 410 and greater than a width W22 of the second solder ball 420. For example, a maximum width of the third solder ball 430 may be smaller than a maximum width of the first solder ball 410 and greater than a maximum width of the second solder ball 420. In some embodiments, the volume of the third solder ball 430 may be the same as the volume of the first solder ball 410 and the volume of the second solder ball 420.

Figure 11:
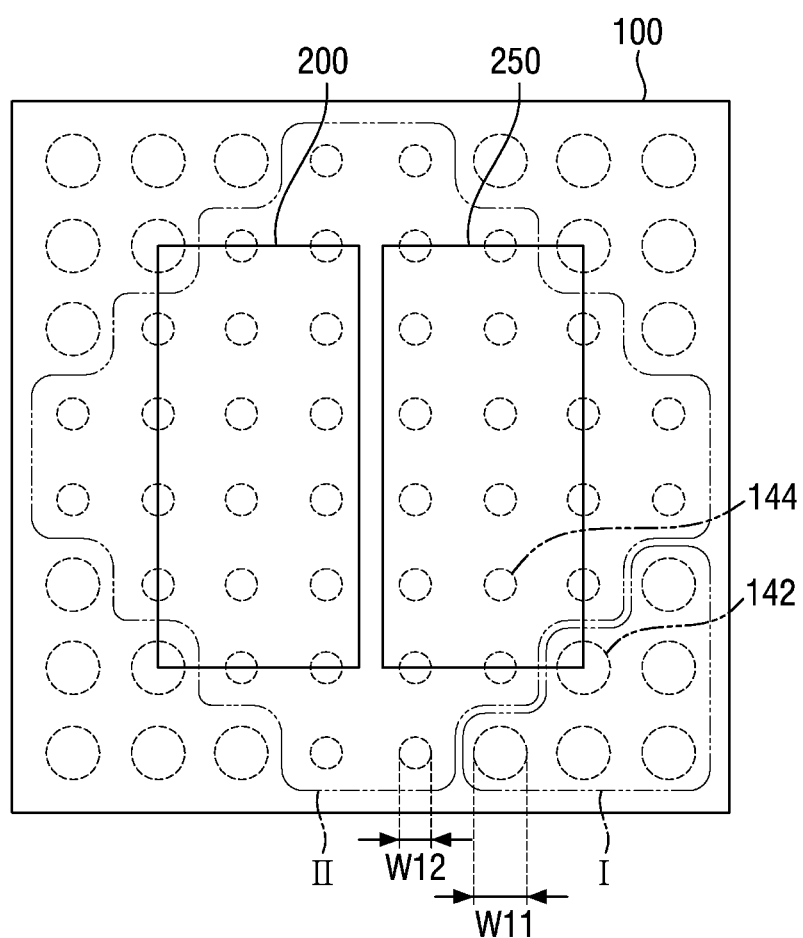
FIG. 11 is a schematic layout diagram for explaining a semiconductor package according to some embodiments.

FIG. 11 is a schematic layout diagram for explaining a semiconductor package according to some embodiments. For convenience of explanation, repeated parts of the contents described above with reference to FIGS. 1 to 4 will be briefly described or omitted.

Referring to FIG. 11, a semiconductor package according to some embodiments includes a plurality of semiconductor chips.

For example, the semiconductor package according to some embodiments may further include a second semiconductor chip 250 that is distinct from the first semiconductor chip 200. The second semiconductor chip 250 may be mounted on the first face (e.g., 100a of FIG. 2) of the redistribution structure 100.

In some embodiments, the first semiconductor chip 200 and the second semiconductor chip 250 may perform functions that are different from each other. For example, the first semiconductor chip 200 may be an application processor (AP), and the second semiconductor chip 250 may be a memory chip such as a volatile memory (e.g., DRAM) or a non-volatile memory (e.g., as ROM or a flash memory).

Figure 12:
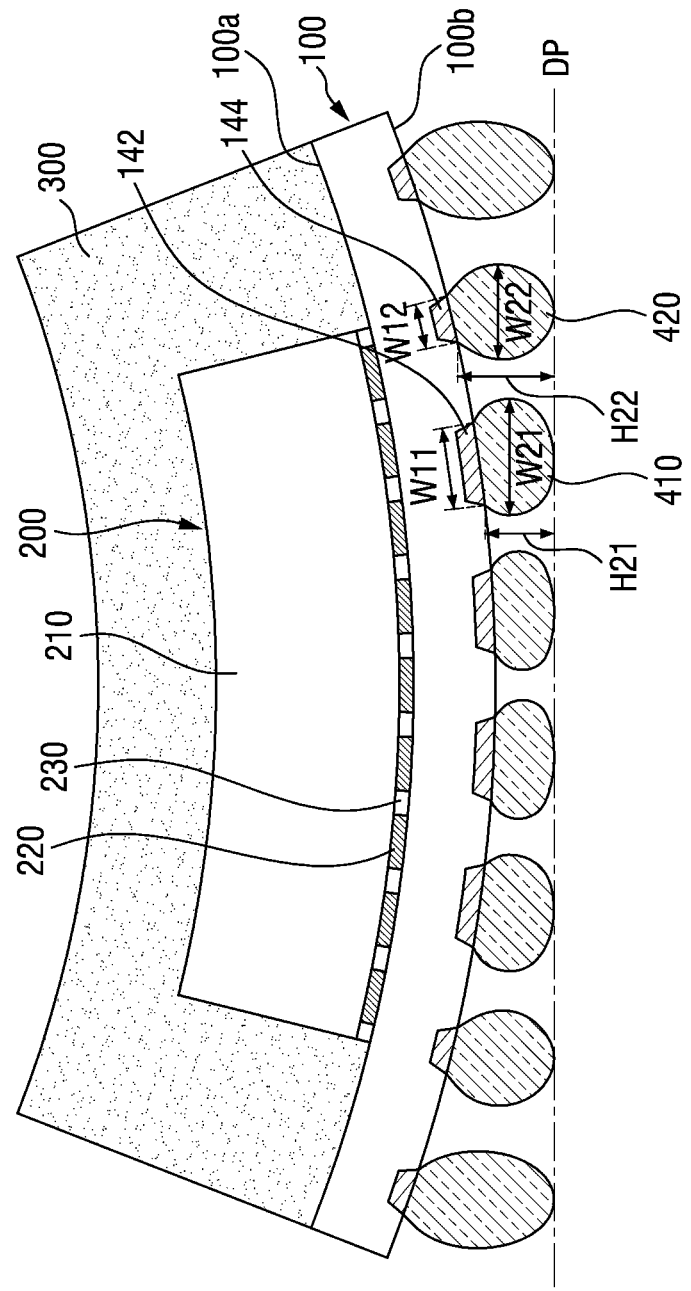
FIG. 12 is a schematic cross-sectional view for explaining a semiconductor package according to some embodiments.

FIG. 12 is a schematic cross-sectional view for explaining a semiconductor package according to some embodiments. For convenience of explanation, repeated parts of the contents described above with reference to FIGS. 1 to 4 will be briefly described or omitted.

Referring to FIG. 12, the second face 100b of the redistribution structure 100 may become convex downward.

For example, since a warpage occurs in the semiconductor package according to some embodiments, the second face 100b of the redistribution structure 100 may become convex downward.

In such a case, the first redistribution pad 142 may be spaced apart from the edge of the redistribution structure 100 further than the second redistribution pad 144. As described above, the width W11 of the first redistribution pad 142 may be greater than the width W12 of the second redistribution pad 144. At this time, the height H22 of the second solder ball 420 connected to the second redistribution pad 144 may be formed to be greater than the height H21 of the first solder ball 410 connected to the first redistribution pad 142 (where H22 and H21 are measured with respect to the reference plane DP). As a result, since coplanarity of the lowermost portion of the first solder ball 410 and the lowermost portion of the second solder ball 420 is improved, a semiconductor package with improved connection reliability can be provided.

In some embodiments, the width W21 of the first solder ball 410 may be greater than the width W22 of the second solder ball 420. In some embodiments, the width W21 of the first solder ball 410 may be measured by a line that is parallel to the reference plane DP which has the maximum length. For example, a line that is parallel to the reference plane DP and corresponds to a maximum width of a solder ball, e.g., 410, 420. In some embodiments, the volume of the first solder ball 410 may be the same as the volume of the second solder ball 420.

Figure 13:
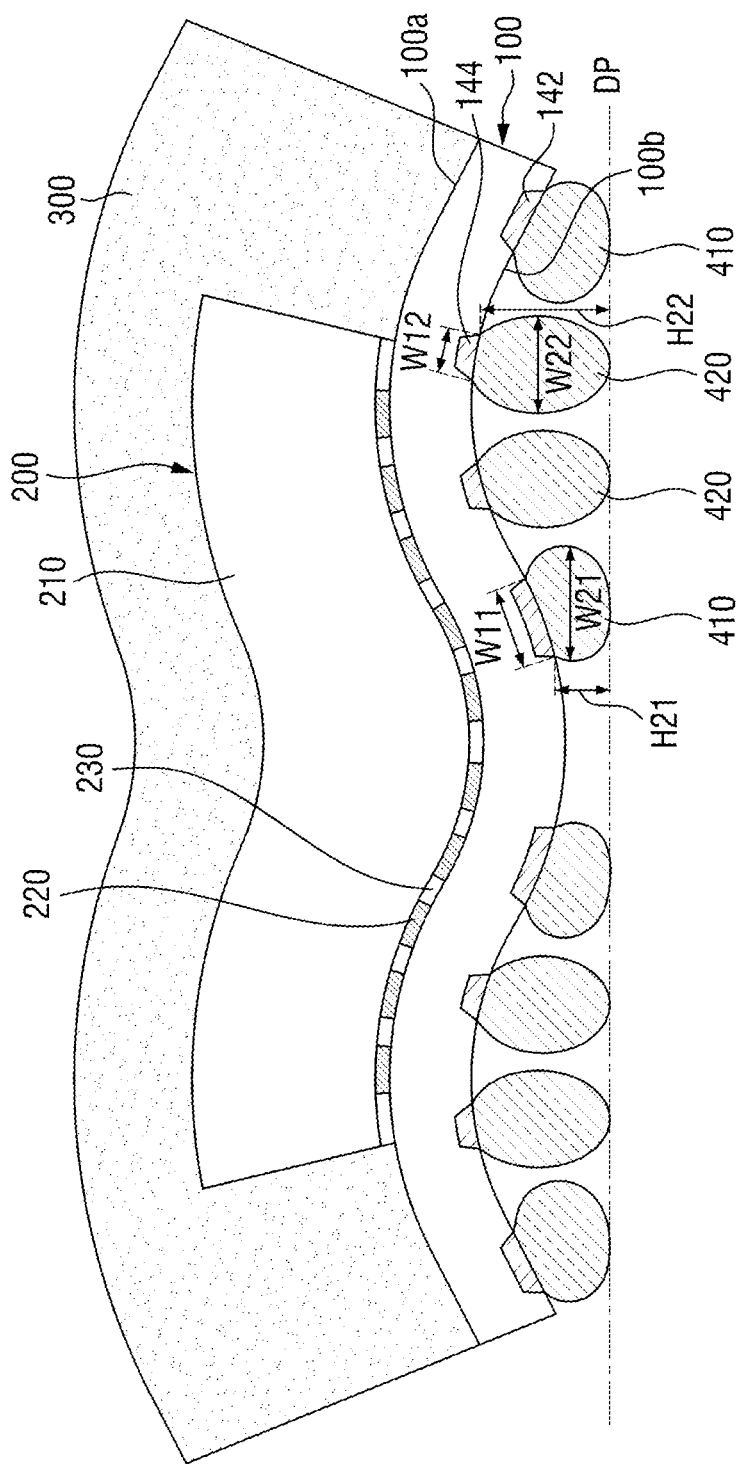
FIG. 13 is a schematic cross-sectional view for explaining a semiconductor package according to some embodiments.
Figure 14:
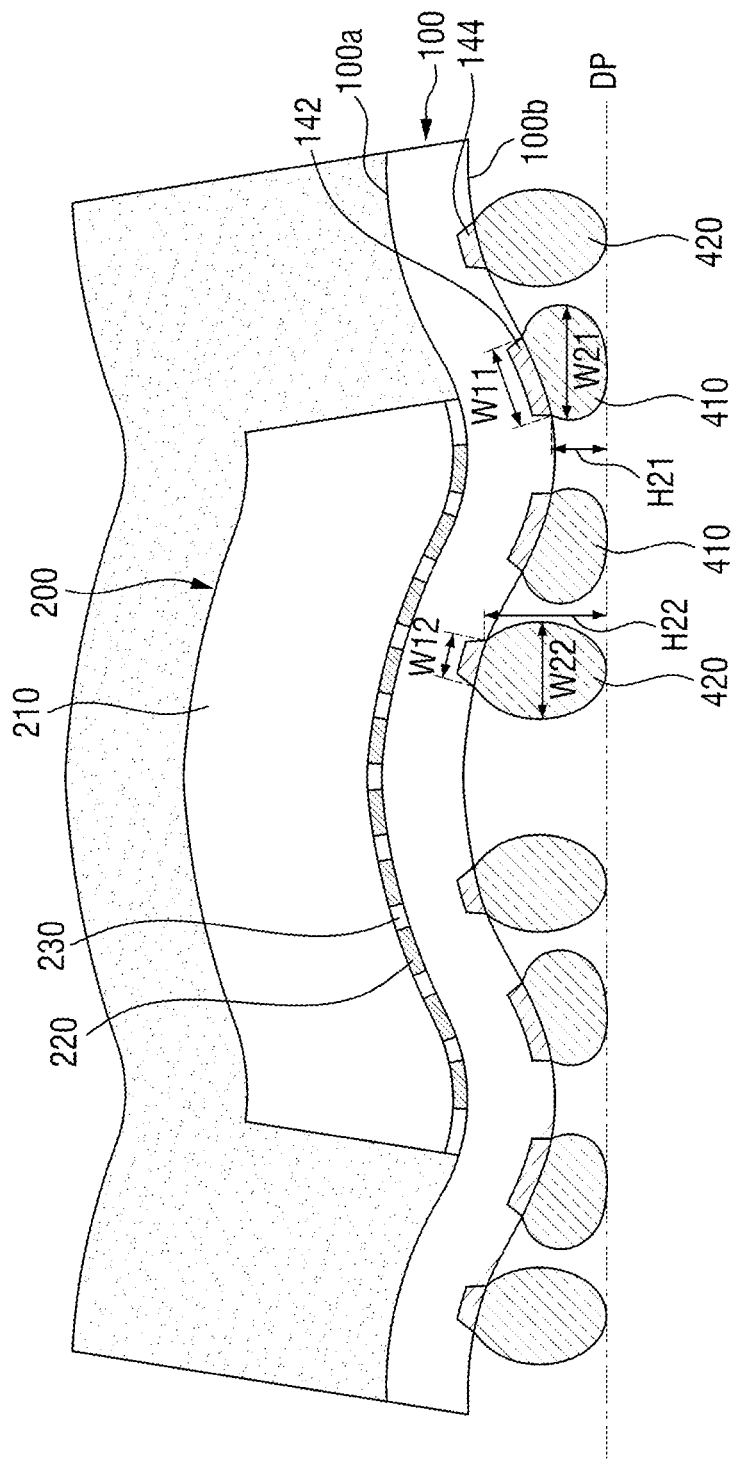
FIG. 14 is a schematic cross-sectional view for explaining a semiconductor package according to some embodiments.

FIG. 13 is a schematic cross-sectional view for explaining a semiconductor package according to some embodiments. FIG. 14 is a schematic cross-sectional view for explaining a semiconductor package according to some embodiments.

For convenience of explanation, repeated parts of the contents described above with reference to FIGS. 1 to 4 will be briefly described or omitted.

Referring to FIGS. 13 and 14, the second face 100b of the redistribution structure 100 may form a meandering shape (e.g., a waveform like shape having an undulating surface).

For example, since a warpage occurs in the semiconductor package according to some embodiments, the second face 100b of the redistribution structure 100 may meander and have a waveform like shape or an undulating surface.

In such a case, the first redistribution pad 142 and the second redistribution pad 144 may be arranged so that the first distance of the first redistribution pad 142 becomes smaller than the second distance of the second redistribution pad 144, when measured with respect to the reference plane DP. In some embodiments, the respective distances of the redistribution pads 142, 144 may correspond to a shortest distance line which projects perpendicularly from the reference plane DP to the nearest point of redistribution pads 142, 144, respectively.

As described above, the width W11 of the first redistribution pad 142 may be greater than the width W12 of the second redistribution pad 144. At this time, the height H22 of the second solder ball 420 connected to the second redistribution pad 144 may be formed to be greater than the height H21 of the first solder ball 410 connected to the first redistribution pad 142 when measured with respect to the reference plane DP. As a result, since coplanarity of the lowermost portion of the first solder ball 410 and the lowermost portion of the second solder ball 420 is improved, a semiconductor package with improved connection reliability can be provided.

Figure 15:
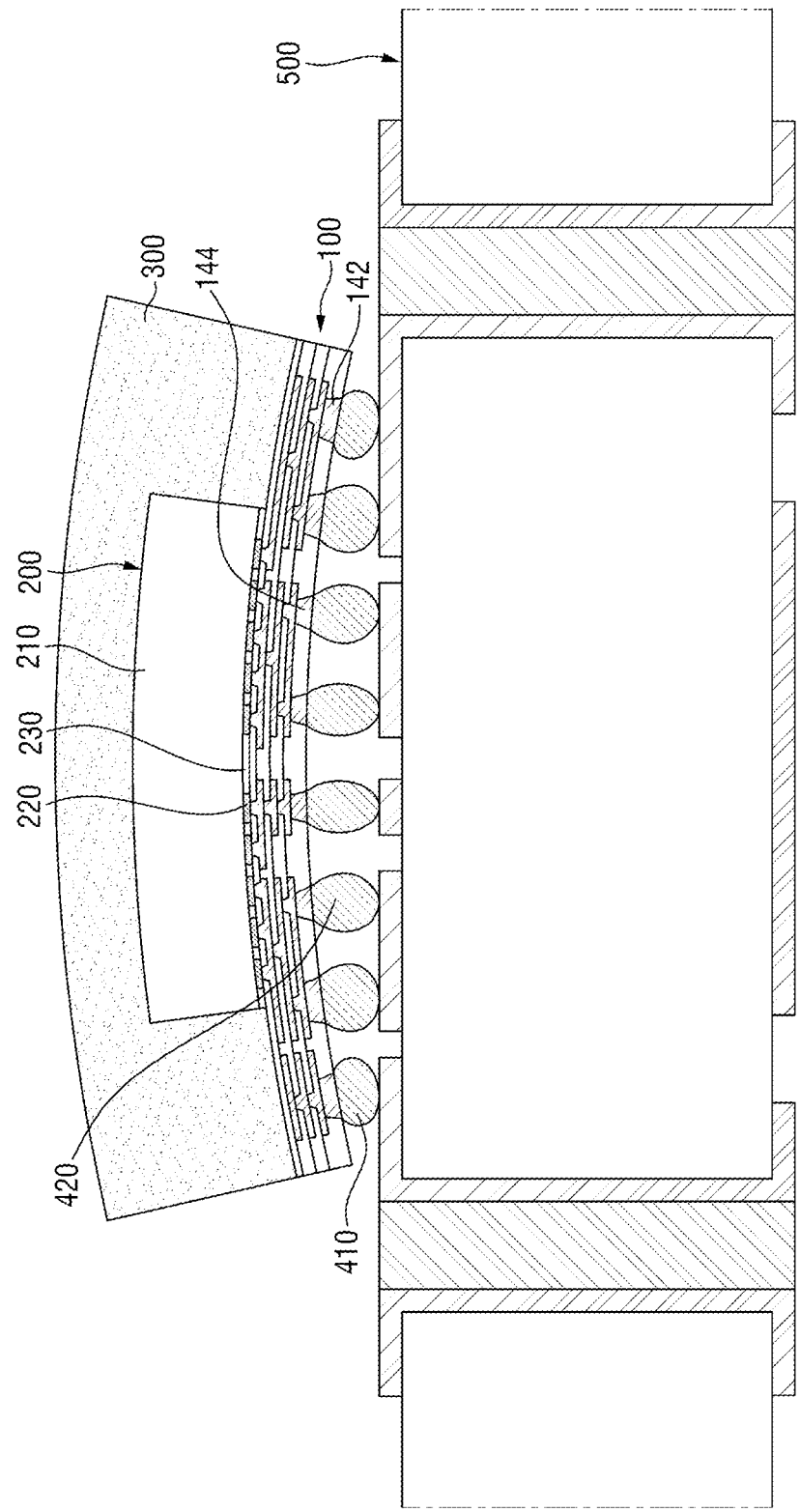
FIG. 15 is a schematic cross-sectional view for explaining an electronic device including the semiconductor package according to some embodiments.

FIG. 15 is a schematic cross-sectional view for explaining an electronic device including the semiconductor package according to some embodiments. For convenience of explanation, repeated parts of the contents described above with respect to FIGS. 1 to 4 will be briefly described or omitted.

Referring to FIG. 15, the semiconductor package according to some embodiments may be arranged in an electronic device (not shown).

For example, the semiconductor package according to some embodiments may be mounted on a mainboard 500 (or a mother board) in the electronic device. For example, the first solder ball 410 and the second solder ball 420 may be in contact with the conductive pattern of the mainboard 500. Therefore, the first semiconductor chip 200 may be electrically connected to the mainboard 500.

The electronic device including the mainboard 500 may include, for example, but is not limited to, a smart phone, a personal digital assistant (PDA), a digital video camera, a digital still camera, a network system, a computer, a monitor, a tablet, a laptop, a netbook, a television, a video game, a smart watch, an automotive or the like. For example, the electronic device including the mainboard 500 may of course be any other electronic device that processes data.

When the semiconductor package according to some embodiments is mounted on the mainboard 500, a warpage may occur and the redistribution structure 100 may form a curved surface. However, the semiconductor package according to some embodiments may improve connection reliability with the mainboard 500, using the first redistribution pad 142 and the second redistribution pad 144 which have different widths in different regions.

For example, the height H21 of the first redistribution pad 142 may be arranged to be smaller than the height H22 of the second redistribution pad 144 when measured with respect to the upper face of the mainboard 500. For example, an upper face of the mainboard 500 may correspond to the reference plane DP, as explained above, and, accordingly the heights H21, H22 may be measured with respect to the upper face of the mainboard 500. As a result, since the coplanarity of the lowermost portion of the first solder ball 410 and the lowermost portion of the second solder ball 420 is improved, a semiconductor package with improved connection reliability can be provided.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor package comprising:
   a redistribution structure including a first face and a second face opposite to each other;
   a first semiconductor chip mounted on the first face of the redistribution structure;
   a first redistribution pad exposed from the second face of the redistribution structure and having a first width;
   a second redistribution pad exposed from the second face of the redistribution structure and having a second width smaller than the first width of the first redistribution pad;
   a first solder ball being in contact with the first redistribution pad and having a third width; and
   a second solder ball being in contact with the second redistribution pad and having a fourth width smaller than the third width of the first solder ball,
   wherein a first distance of the first redistribution pad is smaller than a second distance of the second redistribution pad, the first and second distances are measured with respect to a reference plane that intersects a lower portion of the first solder ball and a lower portion of the second solder ball.

2. The semiconductor package of claim 1, wherein the redistribution structure comprises a chip region which overlaps the first semiconductor chip, and a fan-out region which does not overlap the first semiconductor chip.

3. The semiconductor package of claim 1, further comprising:
   a molding part which covers at least a portion of the first semiconductor chip, over the first face of the redistribution structure.

4. The semiconductor package of claim 3, wherein a side face of the molding part is continuous with a side face of the redistribution structure.

5. The semiconductor package of claim 1, wherein the redistribution structure comprises:
   a plurality of insulating layers including a photoimageable dielectric (PID);
   a plurality of redistribution layers stacked sequentially inside the plurality of insulating layers in a direction from the first face toward the second face; and
   a plurality of vias which penetrates the insulating layers and connect the redistribution layers to each other.

6. The semiconductor package of claim 5, wherein widths of each via of the plurality of vias gradually decrease in a direction from the second face toward the first face.

7. The semiconductor package of claim 5, wherein widths of each via of the plurality of vias gradually decrease in a direction from the first face toward the second face.

8. The semiconductor package of claim 7, further comprising:
a plurality of chip bumps which electrically connects the first semiconductor chip and the redistribution structure.

9. The semiconductor package of claim 1, wherein a first contact face of the first redistribution pad being in contact with the first solder ball, and a second contact face of the second redistribution pad being in contact with the second solder ball are continuous with the second face of the redistribution structure or protrude from the second face of the redistribution structure.

10. The semiconductor package of claim 1, wherein the second face of the redistribution structure is concave downward.

11. The semiconductor package of claim 1, wherein the second redistribution pad is spaced apart from an edge of the redistribution structure further than the first redistribution pad.

12. The semiconductor package of claim 1, further comprising:
a second semiconductor chip mounted on the first face of the redistribution structure.

13. A semiconductor package comprising:
a redistribution structure including a first face, and a second face which is opposite to the first face and concave downward;
a semiconductor chip mounted on the first face of the redistribution structure;
a first redistribution pad exposed from the second face of the redistribution structure and having a first width;
a second redistribution pad which is spaced apart from an edge of the redistribution structure further than the first redistribution pad, is exposed from the second face of the redistribution structure, and has a second width smaller than the first width of the first redistribution pad;
a first solder ball which is in contact with the first redistribution pad and has a third width and a first height; and
a second solder ball which is in contact with the second redistribution pad and has a fourth width smaller than the third width of the first solder ball and a second height larger than the first height of the first solder ball.

14. The semiconductor package of claim 13, wherein the redistribution structure comprises a chip region which overlaps the semiconductor chip, and a fan-out region which does not overlap the semiconductor chip.

15. The semiconductor package of claim 14, wherein the first redistribution pad is arranged in the fan-out region, and the second redistribution pad is arranged in the chip region.

16. The semiconductor package of claim 14, further comprising:
a molding part which covers the semiconductor chip and the fan-out region.

17. The semiconductor package of claim 13, wherein a first volume of the first solder ball is the same as a second volume of the second solder ball.

18. The semiconductor package of claim 13, further comprising:
a third redistribution pad disposed between the first redistribution pad and the second redistribution pad, the third redistribution pad being exposed from the second face of the redistribution structure and having a third width smaller than the first width of the first redistribution pad and greater than the second width of the second redistribution pad, and
a third solder ball being in contact with the third redistribution pad and having a fifth width smaller than the third width of the third redistribution pad and greater than the fourth width of the second solder ball, and a third height greater than the first height of the first solder ball and smaller than the second height of the second solder ball.

19. A semiconductor package mounted on a mainboard, comprising:
a redistribution structure which includes a plurality of insulating layers including a photoimageable dielectric (PID), a plurality of redistribution layers in the insulating layers, and a plurality of vias penetrating the insulating layers to connect the redistribution layers to each other, the redistribution structure including a first face and a second face opposite to each other;
a semiconductor chip mounted on the first face of the redistribution structure;
a molding part which covers at least a portion of the semiconductor chip on the first face of the redistribution structure;
a first redistribution pad exposed from the second face of the redistribution structure and having a first width;
a second redistribution pad exposed from the second face of the redistribution structure and having a second width smaller than the first width of the first redistribution pad;
a first solder ball being in contact with the first redistribution pad and the mainboard and having a third width; and
a second solder ball being in contact with the second redistribution pad and the mainboard, and having a fourth width smaller than the third width of the first solder ball,
wherein a first distance of the first redistribution pad is smaller than a second distance of the second redistribution pad, the first and second distances are measured with respect to an upper face of the mainboard.

20. The semiconductor package of claim 19, wherein the second redistribution pad is spaced apart from an edge of the redistribution structure further than the first redistribution pad.

* * * * *